United States Patent
Im

(10) Patent No.: US 7,925,820 B2
(45) Date of Patent: *Apr. 12, 2011

(54) NONVOLATILE SEMICONDUCTOR MEMORY DEVICE AND PROGRAM METHOD THEREFOR

(75) Inventor: Jae-Woo Im, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 996 days.

This patent is subject to a terminal disclaimer.

(21) Appl. No.: 11/567,162

(22) Filed: Dec. 5, 2006

(65) Prior Publication Data

US 2007/0147133 A1 Jun. 28, 2007

Related U.S. Application Data

(63) Continuation-in-part of application No. 11/025,016, filed on Dec. 28, 2004, now Pat. No. 7,161,839, and a continuation-in-part of application No. 11/206,586, filed on Aug. 17, 2005, now Pat. No. 7,190,619.

(51) Int. Cl.
*G06F 12/00* (2006.01)

(52) U.S. Cl. ............ 711/103; 711/108; 711/E12.002

(58) Field of Classification Search .......... 711/103, 711/108; 365/185.28, 185.18
See application file for complete search history.

(56) References Cited

U.S. PATENT DOCUMENTS

| | | | | |
|---|---|---|---|---|
| 4,463,342 A | * | 7/1984 | Langdon et al. | 341/63 |
| 4,901,076 A | * | 2/1990 | Askin et al. | 341/100 |
| 5,079,694 A | * | 1/1992 | Nakagawa et al. | 711/165 |
| 5,267,190 A | | 11/1993 | Easley et al. | |
| 5,283,779 A | * | 2/1994 | Otsuki | 369/275.2 |
| 5,561,780 A | * | 10/1996 | Glew et al. | 711/126 |
| 6,259,628 B1 | | 7/2001 | Park | |
| 6,362,990 B1 | * | 3/2002 | Gibson et al. | 365/49.1 |
| 6,597,605 B2 | | 7/2003 | Kreifels et al. | |
| 6,657,899 B2 | * | 12/2003 | Roohparvar | 365/185.33 |
| 2003/0043628 A1 | | 3/2003 | Lee | |

FOREIGN PATENT DOCUMENTS

| | | |
|---|---|---|
| JP | 10-334675 | 12/1998 |
| JP | 11-353886 | 12/1999 |
| JP | 2000-149578 | 5/2000 |
| JP | 2002-279789 | 9/2002 |
| KR | 1997-050991 | 10/1997 |
| KR | 2002-0047772 | 6/2002 |
| KR | 2002-0087168 | 11/2002 |

OTHER PUBLICATIONS

English language abstract of Korean Publication No. 1997-050991.
English language abstract of Korean Publication No. 2002-0047772.

(Continued)

*Primary Examiner* — Reginald G Bragdon
*Assistant Examiner* — Victor W Wang
(74) *Attorney, Agent, or Firm* — F. Chau & Associates, LLC

(57) ABSTRACT

A nonvolatile semiconductor memory device and a program method are provided in an embodiment. Data is scanned to search data bits to be selectively programmed. The searched data bits are simultaneously programmed according to a predetermined number. Since data scanning and programming are conducted using a pipeline processing, an average time required for programming data is effectively shortened.

21 Claims, 11 Drawing Sheets

OTHER PUBLICATIONS

English language abstract of Korean Publication No. 2002-0087168.
English language abstract of Japanese Publication No. 10-334675.
English language abstract of Japanese Publication No. 11-353886.
English language abstract of Japanese Publication No. 2000-149578.
English language abstract of Japanese Publication No. 2002-279789.

* cited by examiner

FIG. 4 (THIS INVENTION)

NONVOLATILE SEMICONDUCTOR MEMORY DEVICE AND PROGRAM METHOD THEREFOR

CROSS-REFERENCE TO RELATED APPLICATIONS

This application is a continuation-in-part of U.S. application Ser. No. 11/025,016, filed Dec. 28, 2004, now issued U.S. Pat. No. 7,161,839, which claims priority of Korean Patent Application No. 2004-0077926, filed Sep. 30, 2004, and U.S. application Ser. No. 11/206,586, filed Aug. 17, 2005, now issued U.S. Pat. No. 7,190,619, which claims priority of Korean Patent Application No. 2004-0095595, filed Nov. 22, 2004, now pending, the entire contents of which are hereby incorporated by reference.

BACKGROUND

1. Field of the Embodiments

Some embodiments relate to a nonvolatile semiconductor memory device and, more particularly, to a nonvolatile semiconductor memory device capable of shortening a program time.

2. Description of the Related Art

Nonvolatile semiconductor memory devices, such as flash memories, continuously hold data stored in a cell even when their power supplies are interrupted. Typical flash memories can electrically erase cell data collectively. Therefore, flash memories are widely used in computers, memory cards and the like.

Flash memories are categorized into NOR-type and NAND-type according to their cell-bitline connecting configurations. In a NOR-type flash memory, at least two cell transistors are connected in parallel to a bitline and data is stored using channel hot electrons, and erased using Fowler-Nordheim tunneling (F-N tunneling). In a NAND-type flash memory, at least two cell transistors are connected in series to a bitline and data is stored and erased using F-N tunneling. With a large consumption of current, NOR-type flash memories are disadvantageous in high integration density. With a smaller consumption of cell current than for NOR-type flash memories, NAND-type flash memories are advantageous in high integration density.

A cell array of a NOR-type flash memory includes a plurality of banks, each having a plurality of sectors, each having a plurality of memory cells. Generally, an erase operation of a NOR-type flash memory is executed by sectors and a program operation thereof is executed by words (or bytes).

In order to program data to a cell array of a NOR-type flash memory, a program command is input to the flash memory. A program address and program data are input to the flash memory. The input program address and program data are temporarily stored in a chip. A memory cell corresponding to the program address is selected. A program voltage corresponding to the program data is applied to a bitline, selectively executing a program operation. After passing an internally predetermined program execution time, a verify operation is executed to verify whether the data is programmed to the selected memory cell. Such program and verify operations are iteratively executed until the data is normally programmed to the selected memory cell.

For hot channel electrons used to program a NOR-type flash memory, a high voltage of 4-6 volts is applied to a drain of a memory cell. Therefore, program current over a determined level is needed. Since the high voltage applied to the drain is generated through a charge pump constructed in a chip, the number of simultaneously programmed memories is just two to four. For example, if the number of simultaneously programmed bits is four, 16-bit data is divided by 4 bits and programmed to a memory cell four times.

A program characteristic of a flash memory will now be described in brief. In order to execute a program operation in a flash memory, a corresponding address section must be erased (i.e., a data value is made to be "0") beforehand. Therefore, a no-program operation is executed before programming desired data to erase an address section, even though, in a bit-by-bit perspective, this is redundant and a waste of time for desired data bits that are "0". Most flash memories uniformly assign a determined program time to each data group irrespective of the fact that a value of data to be programmed is "0" or "1". As a result, a determined time is required for programming data irrespective of a value of the program data. This presents an overall program time that is excessively long.

SUMMARY

An embodiment provides a program method of a nonvolatile semiconductor memory device. The program method comprises scanning a first group of data bits to be programmed among input data bits, wherein programming the scanned data bits and subsequent-scanning subsequent data bits to be programmed next is performed while the scanned previous data bits are programmed.

Preferably, the programming and scanning are performed using a pipeline processing.

Other embodiments provide a nonvolatile semiconductor memory device. The nonvolatile semiconductor memory device comprises a data scanning unit and a write driver. The data scanning unit searches previous data bits to be programmed among input data bits, and searches subsequent data bits to be programmed next while the searched previous data bits are programmed. The write driver receives and stores the searched data bits. The write driver programs the searched data bits.

Preferably, the write driver includes a write latch to receive and store the searched data bits.

Other embodiments provide a scan termination indication circuit for indicating a termination of bit scanning of bits to be programmed in a nonvolatile semiconductor memory device. The scan termination indication circuit comprises a counting unit and a comparison unit. The counting unit counts data bits to be programmed. The comparison unit provides a scan termination signal indicating that the number of counted data bits attains the simultaneous program bit number. The simultaneous program bit number may be externally controlled.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
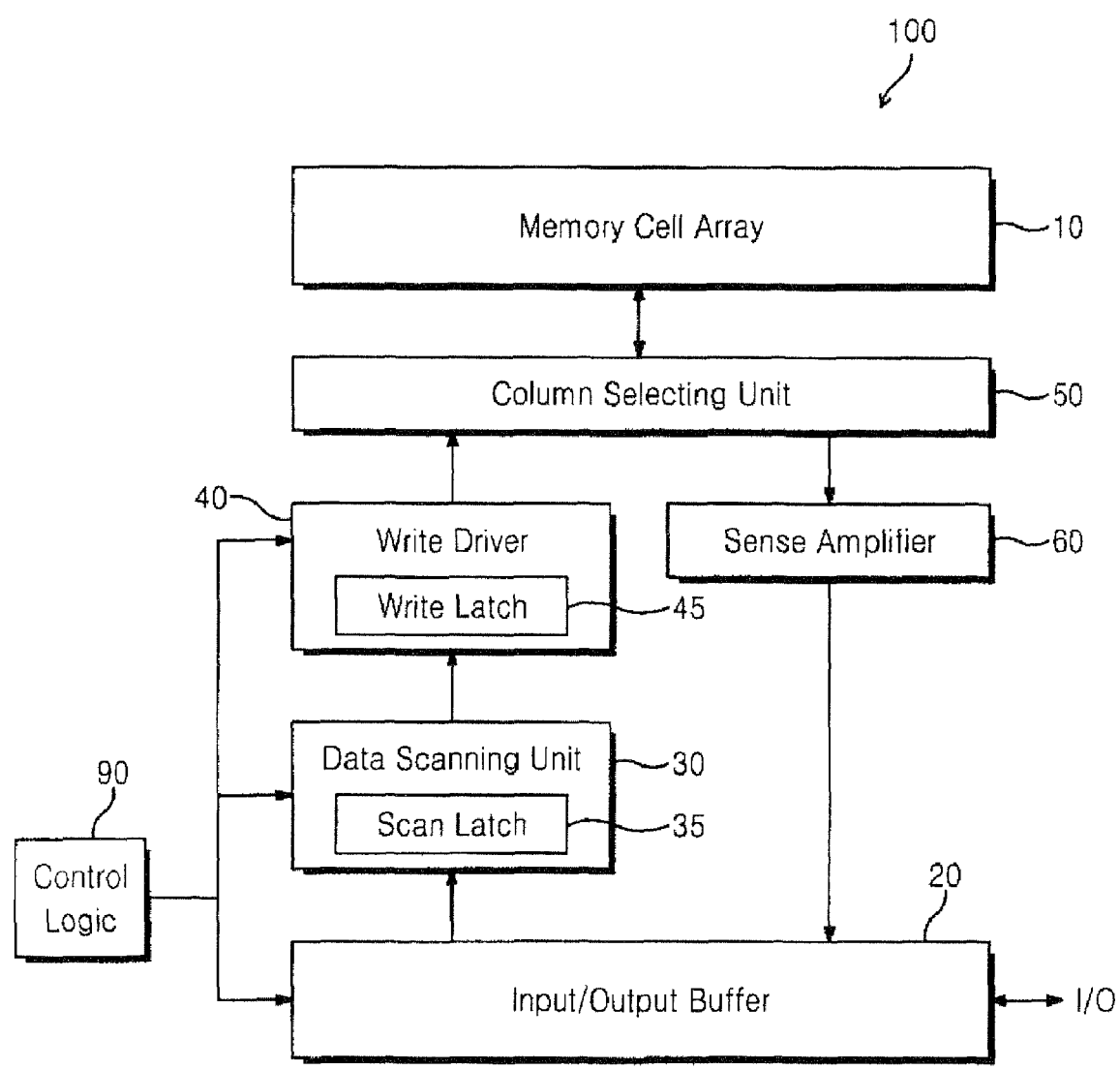
FIG. 1 illustrates a configuration of a semiconductor memory device 100 according to an embodiment.

The above and other objects, features and other advantages of the present invention will be more clearly understood from the following detailed description taken in conjunction with the accompanying drawings. Reference now should be made to the drawings, in which the same reference numerals are used throughout the different drawings to designate the same or similar components.

Hereinafter, embodiments will be described in detail with reference to the attached drawings.

A nonvolatile semiconductor memory device according to embodiments scans data bits to be selectively programmed among program data and programs the scanned data bits by predetermined bits. Such a program scheme is called a "bit scanning program scheme". Scanning data bits to be selectively programmed and programming the scanned data bits selectively is conducted using a pipeline processing, effectively shortening an average time required for programming data.

In order to execute a program operation in a nonvolatile semiconductor memory device such as a flash memory, a corresponding address section must be erased (a data value is made to be "1") beforehand. Since a program operation executed in a nonvolatile semiconductor memory device is to convert data "1" into data "0", the fact that program data is "1" means desired data is programmed with an execution of a no program operation. Therefore, in the embodiments, only data of value "0" are scanned and programmed to effectively shorten a program time. Particularly, the scanning and programming are simultaneously conducted using a pipeline processing to further shorten the program time.

FIG. 1 illustrates a configuration of a semiconductor memory device 100 according to an embodiment.

A typical semiconductor memory device includes an array area having memory cells and peripheral circuits for selecting rows and columns of the array area. If the array area is divided into a plurality of array blocks, the peripheral circuits are also divided to correspond thereto. Such a configuration of an array area is well known to a person skilled in the art. In an array area that will be described more fully hereinafter, only an array block among a plurality of array blocks and peripheral circuits associated therewith (particularly peripheral circuits associated with a program operation) are illustrated. The semiconductor memory device 100 illustrated in FIG. 1 is exemplarily described with reference to a NOR-type flash memory. Nevertheless, a parallel bit scanning scheme according to the embodiment may be applied to other nonvolatile semiconductor memory devices.

As illustrated in FIG. 1, the semiconductor memory device 100 includes a memory cell array 10, an input/output buffer 20, a data scanning unit 30, a write driver 40, a column selecting unit 50, a sense amplifier 60, and a control logic 90.

The memory cell array 10 has NOR-type flash memory cells. The input/output buffer 20 stores data to be written to the memory cell array and data sensed from the memory cell array 10. The data scanning unit 30 scans data input from the input/output buffer 20 to search for bits of value "0". If the number of the searched bits of value "0" reaches a predetermined simultaneous program bit number SENUM, the data scanning unit 30 transmits a corresponding data bit and address data to the write driver 40 in response to the control of the control logic 90. The simultaneous program bit number SENUM is the maximum number of bits that the write driver 40 can program simultaneously. The simultaneous program bit number SENUM may vary with a circuitry configuration. In the embodiment, the simultaneous program bit number SENUM of four bits will be exemplarily described.

The data scanning unit 30 has a scan latch 35 for performing a scan operation. The scan latch 35 stores data input from the input/output buffer 20. The data stored in the scan latch 35 is used in the scan operation of the scan latch 35. If bits of "0" are searched as many as the simultaneous program bit number SENUM or a scan operation is completed, the data scanning unit 30 transmits corresponding data bit and address to the write driver 40 in response to the control of the control logic 90. Preferably, the size of the scan latch 35 is smaller than the whole size of the input/output buffer 20. For example, if the input/output buffer 20 is configured to have a size of 32 words, the scan latch 35 may be configured to have a size of 8 words. The sizes of the input/output buffer 20 and the scan latch 35 may vary with a circuitry configuration.

The write driver 40 executes a program operation for the cell array 10 using the scan result input from the data scanning unit 30 (i.e., a predetermined-number of bits of data "0" and address data). A write latch 45 is constructed in the write driver 40 to store data to be programmed (the data being received from the input/output buffer 20). Also, the write latch 45 can be constructed on the outside from the write driver 40. That is to say, the write latch 45 can be constructed on between the data scanning unit 30 and the write driver 40.

The column selecting unit 50 selects a bitline (not shown; corresponding to the address data generated from the data scanning unit 30) of the cell array 10 to be programmed by the write driver 40.

During a program operation, the write driver 40 does not program all data but selectively programs only selectively programmed data bits (i.e., data bits having a value "0") and does not program erase-state data bits (i.e., data bits having a value "1"). The number of bits which can be programmed simultaneously is called the simultaneous program bit number SENUM.

Although described in detail later, a scanning operation of the data scanning unit 30 and a program operation of the write driver 40 are simultaneously performed using a pipeline processing. For example, while the write driver 40 programs an (i−1)th scan result generated from the data scanning unit 30, the data scanning unit 30 performs an ith data scanning to search data for "0" to be programmed next. In this way, data scanning and programming operations are simultaneously performed to shorten the time required to program data.

After writing data to the memory cell array 10, the written data is sensed and amplified by the sense amplifier 60. After storing the sensed and amplified data in a corresponding address of the input/output buffer 20, the stored data is output to the outside. It is well known to a person skilled in the art that the data sensed and amplified by the sense amplifier 60 may be used to verify whether a program is pass or fail through a program verify unit (not shown). If the verify result is that the program is fail, the data is re-programmed. The bit scanning program scheme according to the embodiment may be applied to not only an previous program operation but also a re-program operation.

As previously stated, a data scanning operation for searching data bits to be selectively programmed and a program operation relative to a scanned result are simultaneously performed using a pipeline processing. Thus, the time required for a program operation may be shortened.

Figure 2:
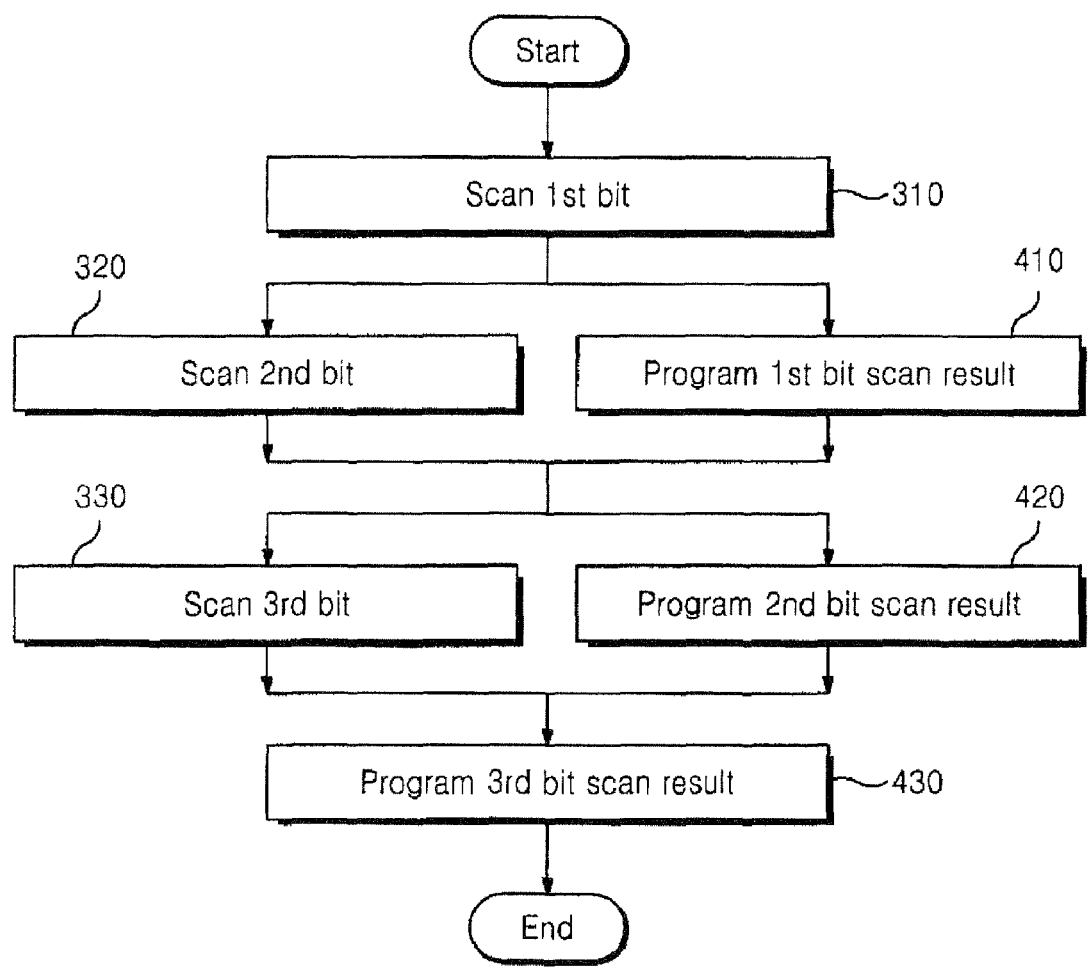
FIG. 2 is a flowchart of a program method according to an embodiment.

A flowchart of a program method according to the embodiment is illustrated in FIG. 2, in which the simultaneous program bit number SENUM is 4 and scan and program operations are performed three times. The times of the scan and program operations illustrated in FIG. 2 may vary with the simultaneous program bit number SENUM, a configuration of the scan latch 35, and so forth.

Referring to FIG. 2, a first bit is scanned through the data scanning unit 30 (step S310).

In step S310, the data scanning unit 30 stores data input from an input/output buffer 20 in a scan latch 35 in response to the control of the control logic 90. The data scanning unit 30 scans the data stored in the scan latch 35 to search data bits having a value "0". If the data bits of "0" are searched as many times as the simultaneous program bit number SENUM, the data scanning unit 30 transmits the searched data bits and address data to a write driver 40. In the embodiment this procedure is called a bit scan operation.

After the first bit is scanned in step S310, the write driver 40 programs the predetermined-number data bits of "0" (predetermined number being the simultaneous program bit number) obtained in the step S310 to a corresponding address of the memory cell array 10. While the first bit scan result is programmed in step S410, the data scanning unit 30 scans a second bit (step S320). The second bit scan operation step S320 may be performed in the same manner as the first bit scan operation step S310. The first and second bit scan program operations performed in the steps S320 and S410 may be simultaneously performed using a pipeline processing.

The write driver 40 programs a second bit scan result obtained in the step S320 (step S420). While the second bit scan result program operation is performed in the step S420, the data scanning unit 30 scans a third bit (step S330). The third bit scan operation S330 may also be performed in the same manner as the first bit scan operation S310. The third and second bit scan result program operations performed in the steps S330 and S420 may be simultaneously performed using a pipeline processing.

If data stored in the scan latch 35 of the data scanning unit 30 are all scanned due to the third bit scan operation performed in the step S330, the write driver 40 programs in the step S430 a third bit scan result obtained in the step S330. When such scan and program operations based on a pipeline processing are described, three-times scan and program operations are merely exemplary for convenience of description. With an increase of scan times and program times, the time required for a program operation may be shorter.

Figure 3:
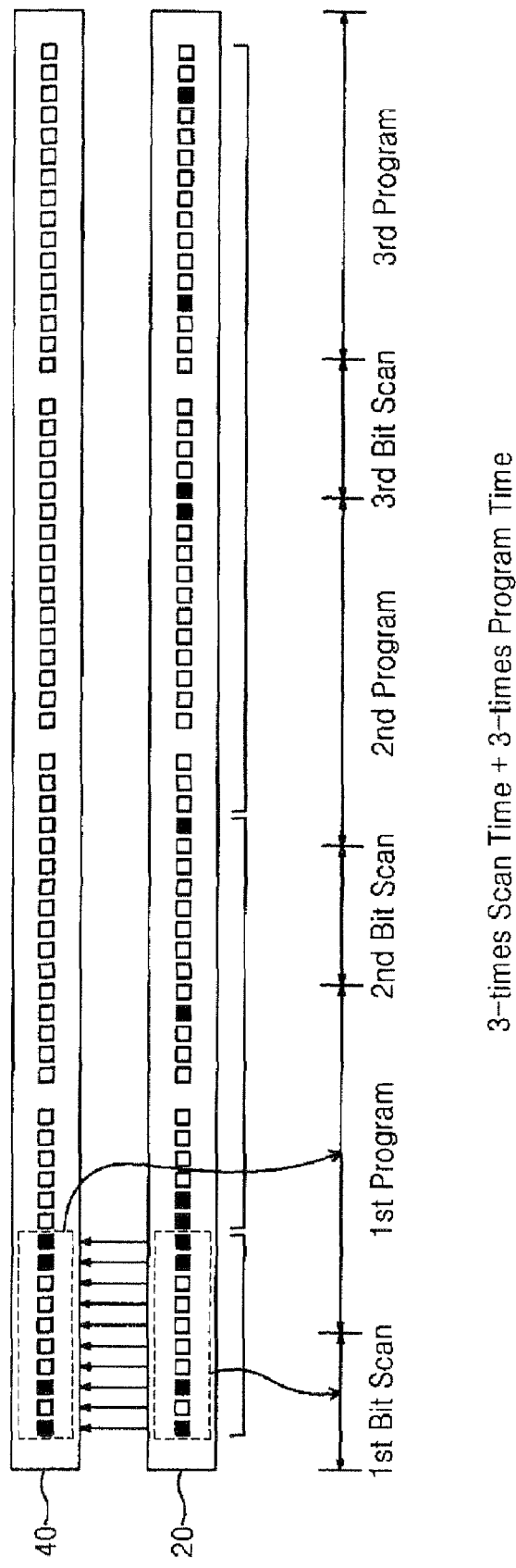
FIG. 3 illustrates a conventional bit scanning program procedure and a program time required.
Figure 4:
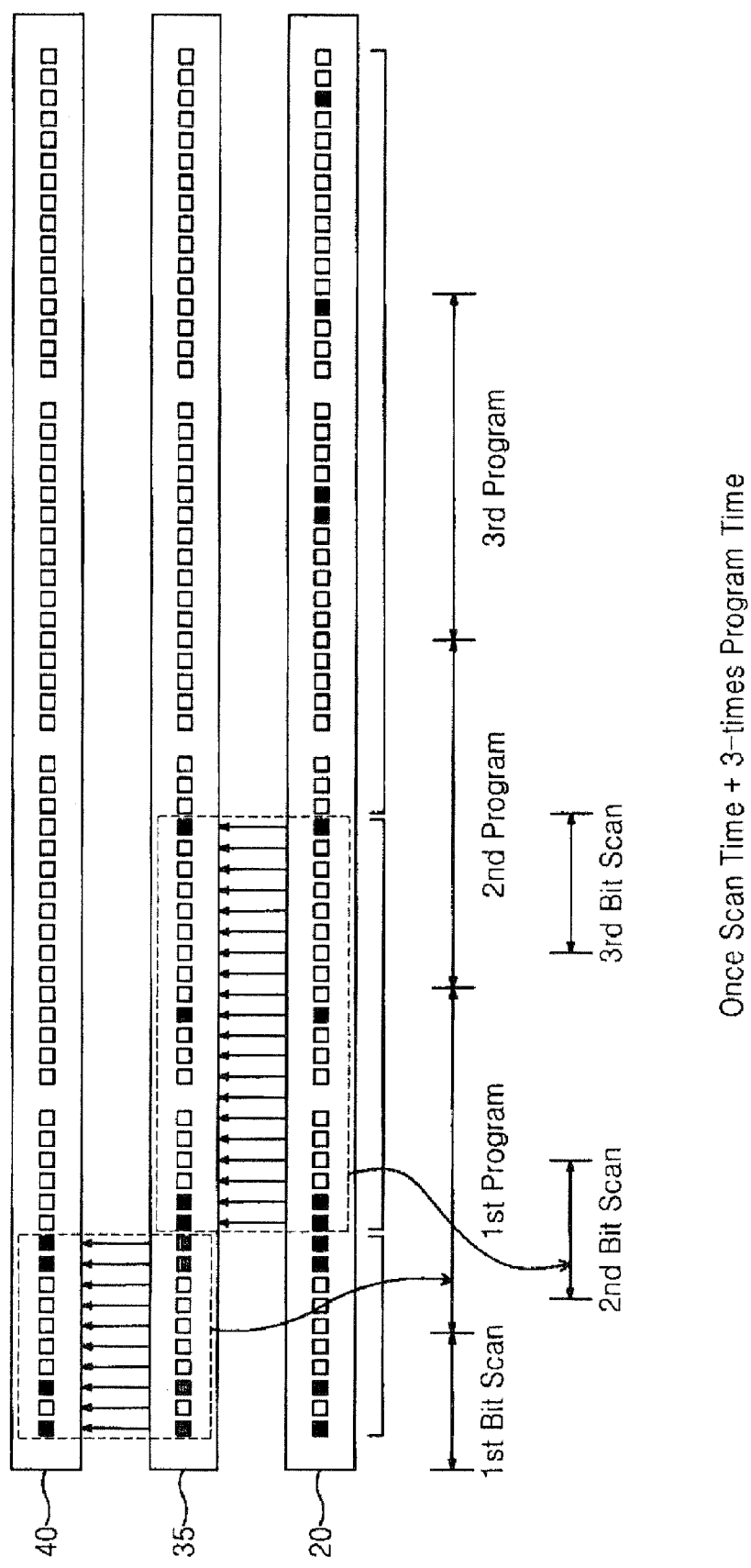
FIG. 4 illustrates a bit scanning program procedure and a required program time according to an embodiment.

FIG. 3 illustrates a conventional bit scanning program procedure and a required program time, and FIG. 4 illustrates a bit scanning program procedure according to an embodiment and a required program time. Numbers on the left in both FIGS. 3 and 4 refer to the element number in FIG. 1 that contains the respective data.

Referring to FIG. 3, a conventional bit scanning program scheme includes a data scanning procedure for searching data of "0" and a program procedure for programming the searched data bits, which are sequentially performed. Therefore, three times the scan time plus three times the program time are required to perform three times the scan and program operations.

As illustrated in FIG. 4, a bit scanning program scheme according to the embodiment includes a data scanning procedure for searching data of "0" and a program procedure for programming the searched data bits, which may be performed using a pipeline processing. Thus, second and third data scanning procedures overlap first and second programming procedures, respectively. In other words, subsequent-scanning procedures for subsequent data bits to be programmed next are performed while the searched previous data bits are still being programmed.

Accordingly, one scan time plus three times the program time are required to perform three times the scan and program operations. With an increase in the size of the data to be programmed, the program time may be further shortened.

As explained so far, the bit scanning method according to the embodiment includes a data scanning operation to search data bits to be selectively programmed and a program operation to program a scanned result, which is performed using a pipeline processing. Thus, time required for a program operation may be greatly reduced.

Figure 5:
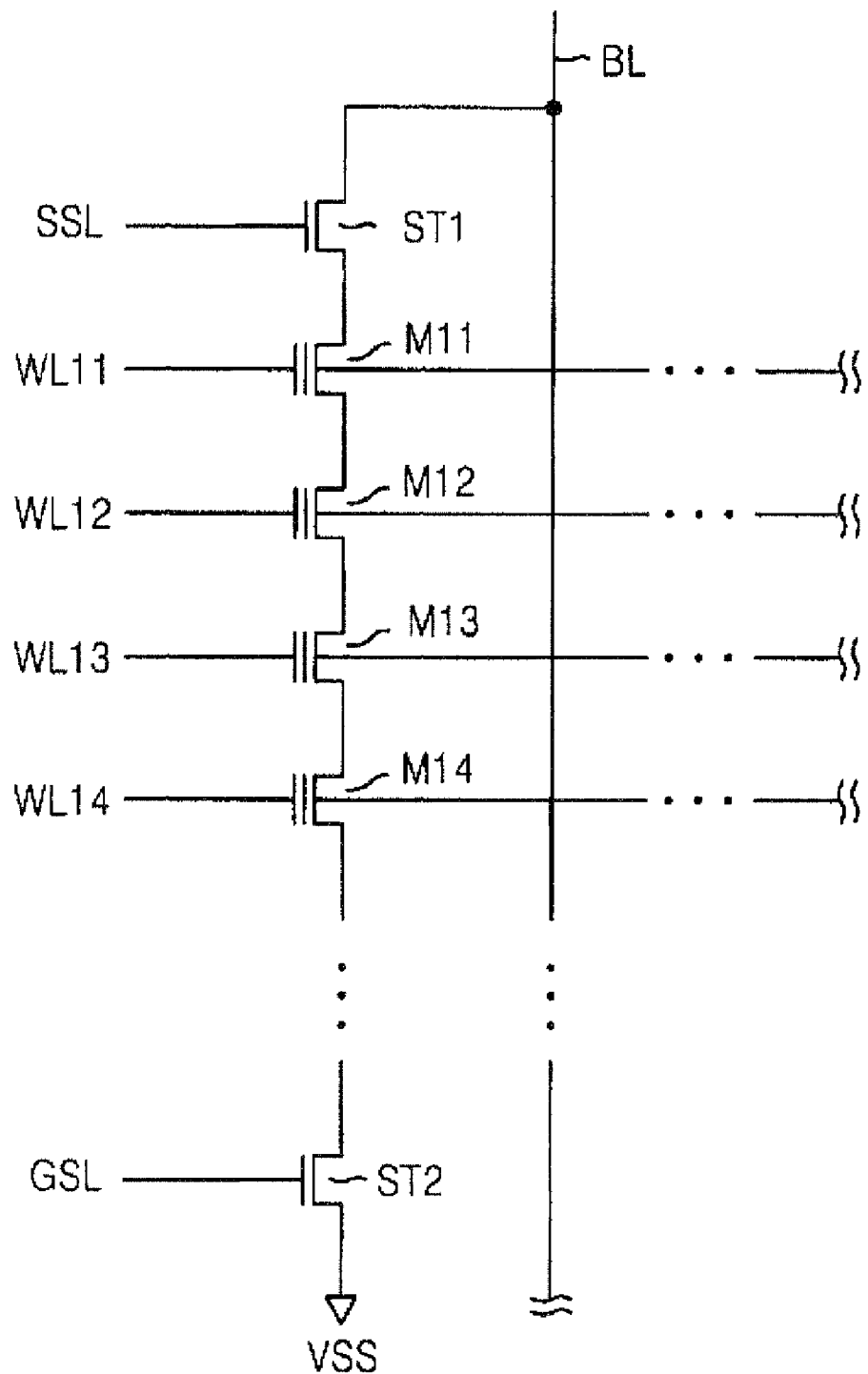
FIG. 5 is a schematic diagram of a memory array of a typical NAND-type nonvolatile semiconductor memory device.

Meanwhile, in the case of a NAND-type nonvolatile semiconductor memory device, memory cells M11 to M14 form a string together with selection transistors ST1 and ST2, and are connected in series with each other between a bit line BL and a ground voltage VSS, as shown in FIG. 5. The programming of such a NAND-type nonvolatile semiconductor memory device may be performed using Fowler-Nordheim (F-N) tunneling. In this case, since a Ground Selection Line (GSL) signal is in a logic L (low) state, the amount of current consumption is relatively low. Therefore, the NAND-type nonvolatile semiconductor memory device performs programming for all memory cells connected to a single word line (any of WL11 to WL14) through a single program operation.

Figure 6:
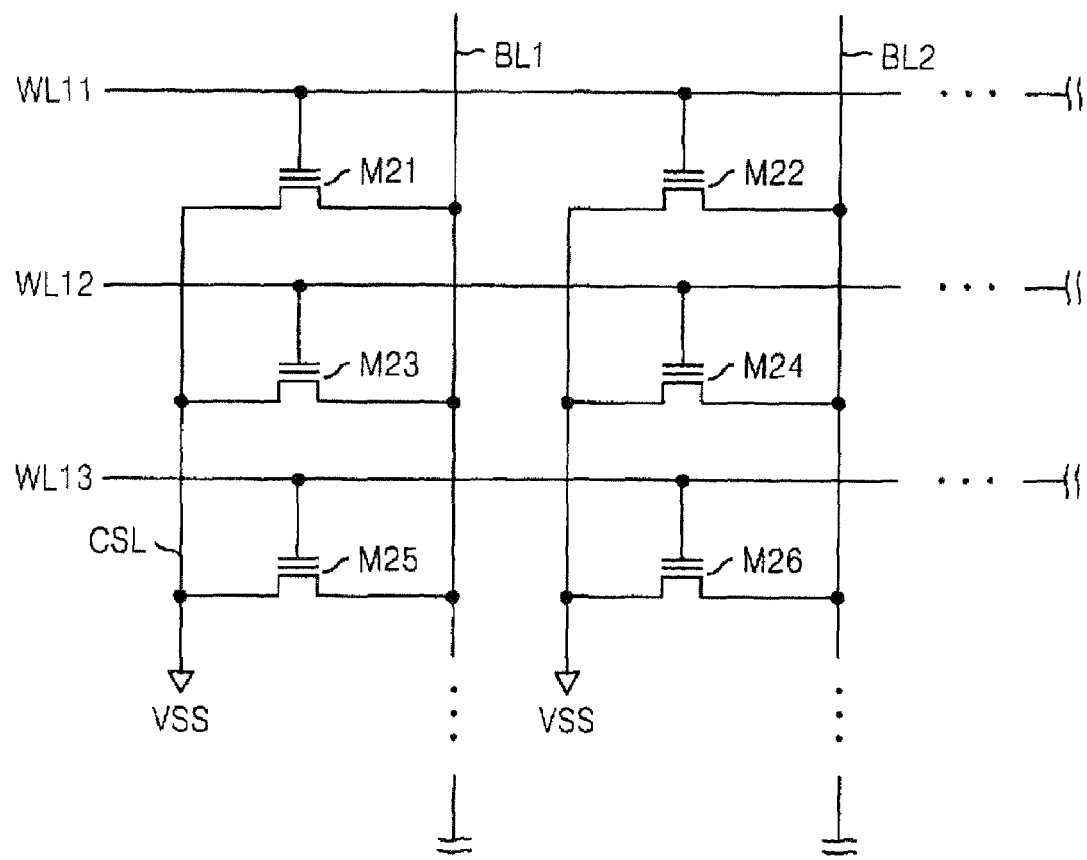
FIG. 6 is a schematic diagram of a memory array of a typical NOR-type nonvolatile semiconductor memory device.

In the meantime, in the case of a NOR-type nonvolatile semiconductor memory device, memory cells M21 to M26 are connected between a bit line BL1 or BL2 and a source line CSL, as shown in FIG. 6. Programming for such a NOR-type nonvolatile semiconductor memory device may be performed using Channel Hot Electron (CHE) injection. In this case, a current path is formed between the bit line BL and the source line CSL, so that the amount of current consumption is relatively high. Accordingly, the NOR-type nonvolatile semiconductor memory device performs programming for memory cells, which are selected a column at a time to allow the number of memory cells to correspond to the simultaneous program bit number, by a single program operation. For this operation, in the NOR-type nonvolatile semiconductor memory device, a data scan operation of scanning a certain number of data bits to be programmed is performed. Further, the NOR-type nonvolatile semiconductor memory device includes a circuit to generate a scan termination signal that indicates the termination of bit scanning of bits to be programmed therein. In other words, the scan termination signal indicates that a number of set data bits to be programmed have been completely scanned.

Figure 7:
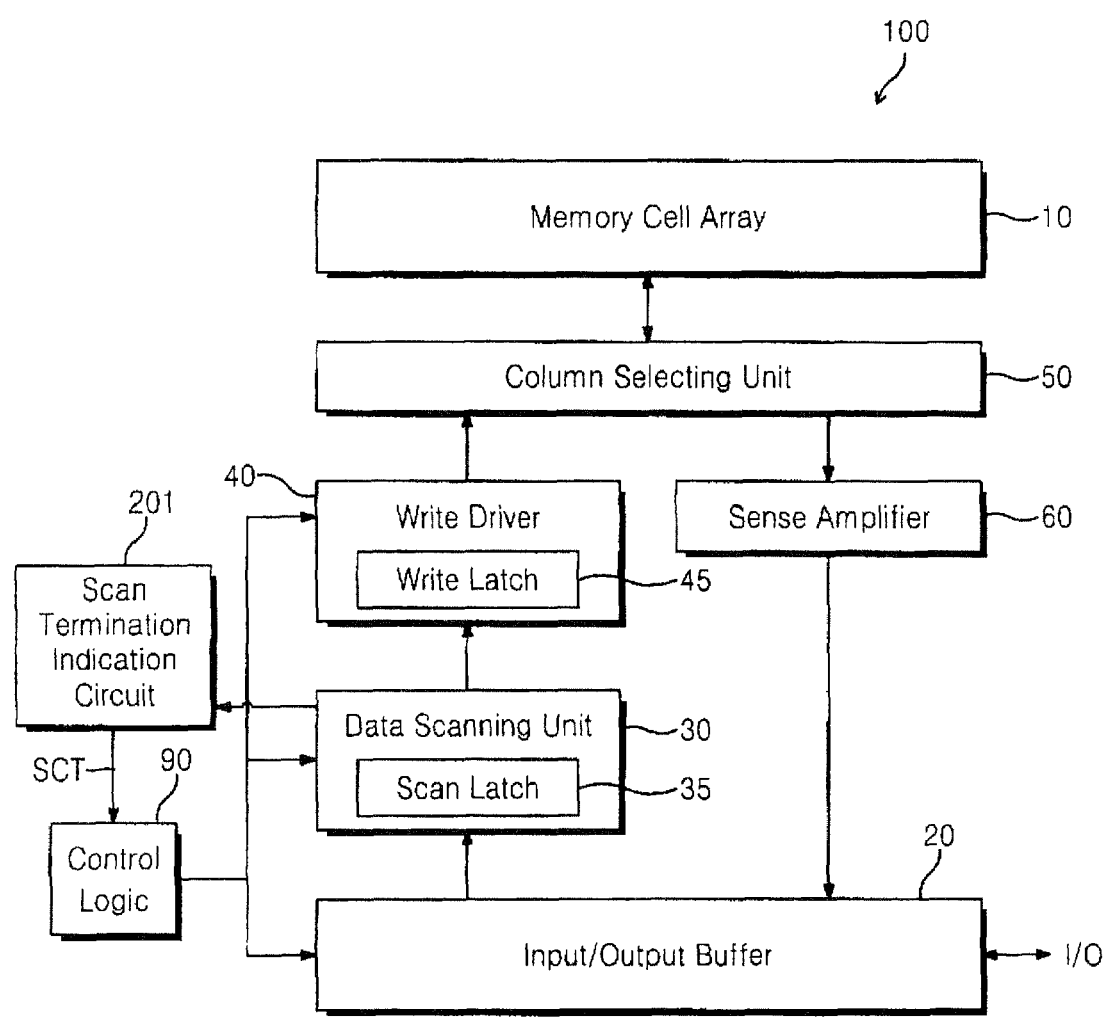
FIG. 7 illustrates a configuration of a semiconductor memory device 100' according to another embodiment.

FIG. 7 illustrates a configuration of a semiconductor memory device 100' according to another embodiment.

The configuration of a semiconductor memory device 100' of FIG. 7 is similar to that of a semiconductor memory device 100 of FIG. 1, except that the semiconductor memory device 100' of FIG. 7 further includes a scan termination indication circuit 201.

The scan termination indication circuit 201 indicates a termination of bit scanning of data bits to be programmed. The circuit 201 counts data bits to be programmed, and provides a scan termination signal SCT that is used to control programming. The scan termination signal SCT indicates that the number of counted data bits attains the simultaneous program bit number SENUM. The simultaneous program bit number SENUM may be externally controlled.

Figure 8:
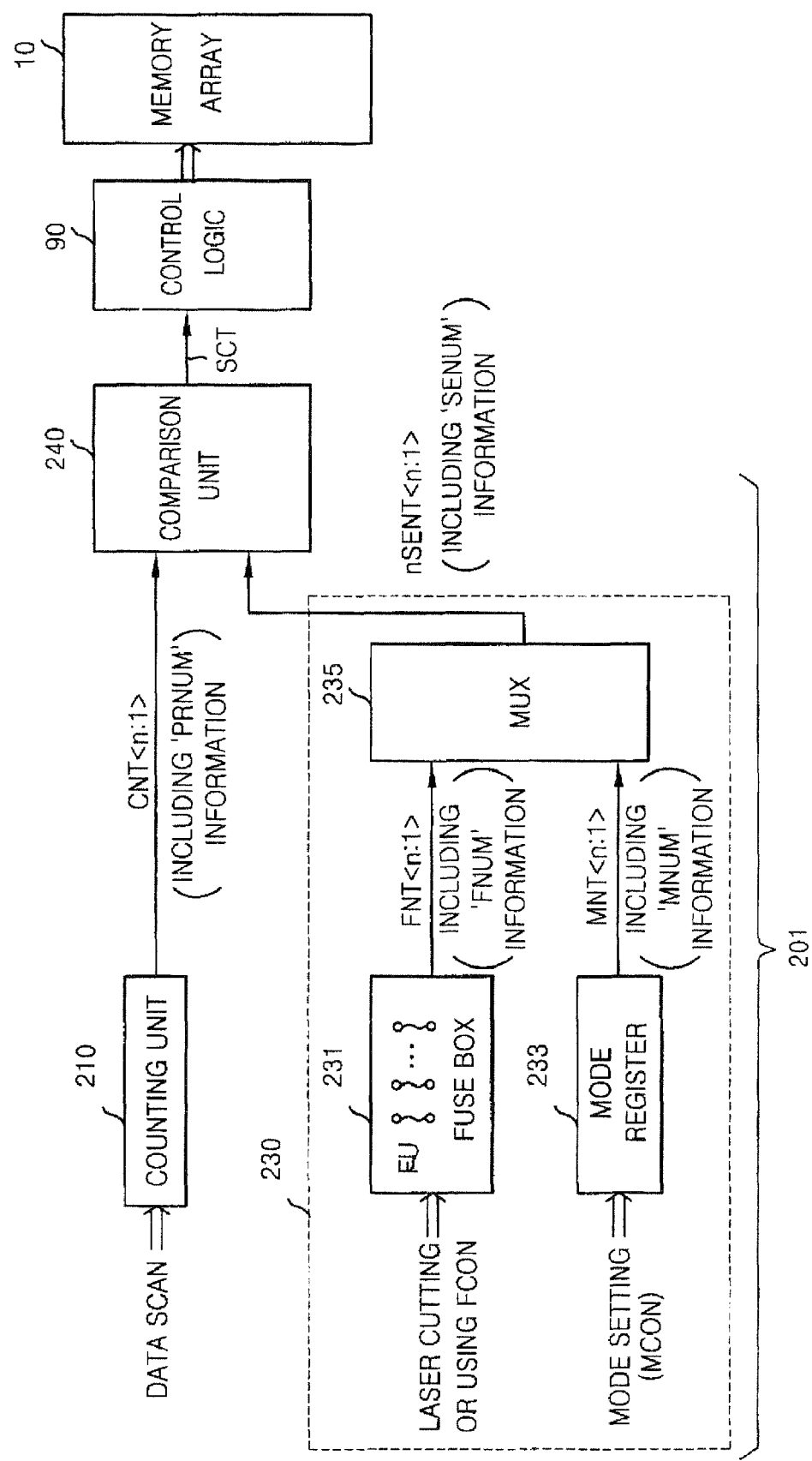
FIG. 8 is a block diagram of a circuit for indicating the termination of bit scanning of bits to be programmed in a nonvolatile semiconductor memory device according to an embodiment.

FIG. 8 shows a circuit 201 for indicating the termination of bit scanning of bits to be programmed in a nonvolatile semiconductor memory device according to another embodiment. The nonvolatile semiconductor memory device to which the present embodiment can be applied is a NOR-type memory device. Therefore, as described above with reference to FIG. 6, memory cells included in a memory array 10 are arranged between word lines and bit lines in a NOR-type array. Further, memory cells, the number of which corresponds to the simultaneous program bit number SENUM, are simultaneously programmed through a single program operation.

Referring to FIG. 8, the circuit 201 for indicating the termination of bit scanning of bits to be programmed according to the present embodiment includes a counting unit 210, a set bit number provision unit 230 and a comparison unit 240. The counting unit 210 counts the predetermined number of bits to be programmed PRNUM. The number of bits to be programmed represents the number of data bits scanned in a data scan operation and the data bits required to be programmed (for example, "0"). The number of bits to be programmed PRNUM can be indicated by a group of counting bit signals CNT<7:0> provided from the counting unit 210 to the comparison unit 240, and this indication method is well known to those skilled in the art.

According to another embodiment, the counting unit 210 can be constructed in data scanning unit 30. The data scanning unit 210 counts data bits to be programmed.

The set bit number provision unit 230 provides a group of set bit signals nSENT<n:1> to the comparison unit 240. The group of set bit signals nSENT<n:1> includes information about the simultaneous program bit number SENUM.

According to a preferred embodiment, the set bit number provision unit 230 includes a fuse box 231, a mode register 233, and a multiplexer (MUX) 235. The fuse box 231 includes a plurality of fuses FU, and provides a group of fuse bit signals FNT<n:1> to the multiplexer MUX 235. Further, information about the number of fuse bits FNUM is included in the group of fuse bit signals FNT<n:1>, and the number of fuse bits FNUM is adjusted according to whether to blow the fuses FU.

Blowing the fuses FU can be externally controlled. For example, the fuses FU can be electrically blown using external laser beams or fuse control signals FCON. Further, the fuses FU can be implemented using flash cells (not shown) that are programmable and erasable in response to external fuse control signals. In this case, each of the flash cells is controlled so that two terminals thereof connected to each other are electrically disconnected according to programming or erasure results.

The mode register 233 provides a group of mode bit signals MNT<n:1> to the MUX 235. The number of mode bits MNUM included in the group of mode bit signals MNT<n:1> can be adjusted in response to external mode setting signals MCON.

The multiplexer MUX 235 selects any one of the group of fuse bit signals FNT<n:1>, provided from the fuse box 231, and the group of mode bit signals MNT<n:1>, provided from the mode register 233, and provides the selected group as the group of set bit signals nSENT<n:1>. The selection of the group of set bit signals nSENT<n:1> performed by the multiplexer MUX 235 can be implemented using a variety of methods, such as a control method using a MUX control signal (not shown) or a method of selecting a signal group having a higher value. Further, such a selection method is apparent to those skilled in the art, so that detailed descriptions are omitted.

Consequently, the simultaneous program bit number SENUM provided from the set bit number provision unit 230 can be externally controlled after the manufacture of the nonvolatile semiconductor memory device has been completed.

The comparison unit 240 compares the group of counting bit signals CNT<n:1> with the group of set bit signals nSENT<n:1> and provides a scan terminal signal SCT. The level of the scan termination signal SCT is changed when the number of bits to be programmed PRUM attains the simultaneous program bit number SENUM. Further, the scan termination signal SCT is provided to the control logic 90 and ultimately controls programming for the memory cells in the memory array 10.

Figure 9:
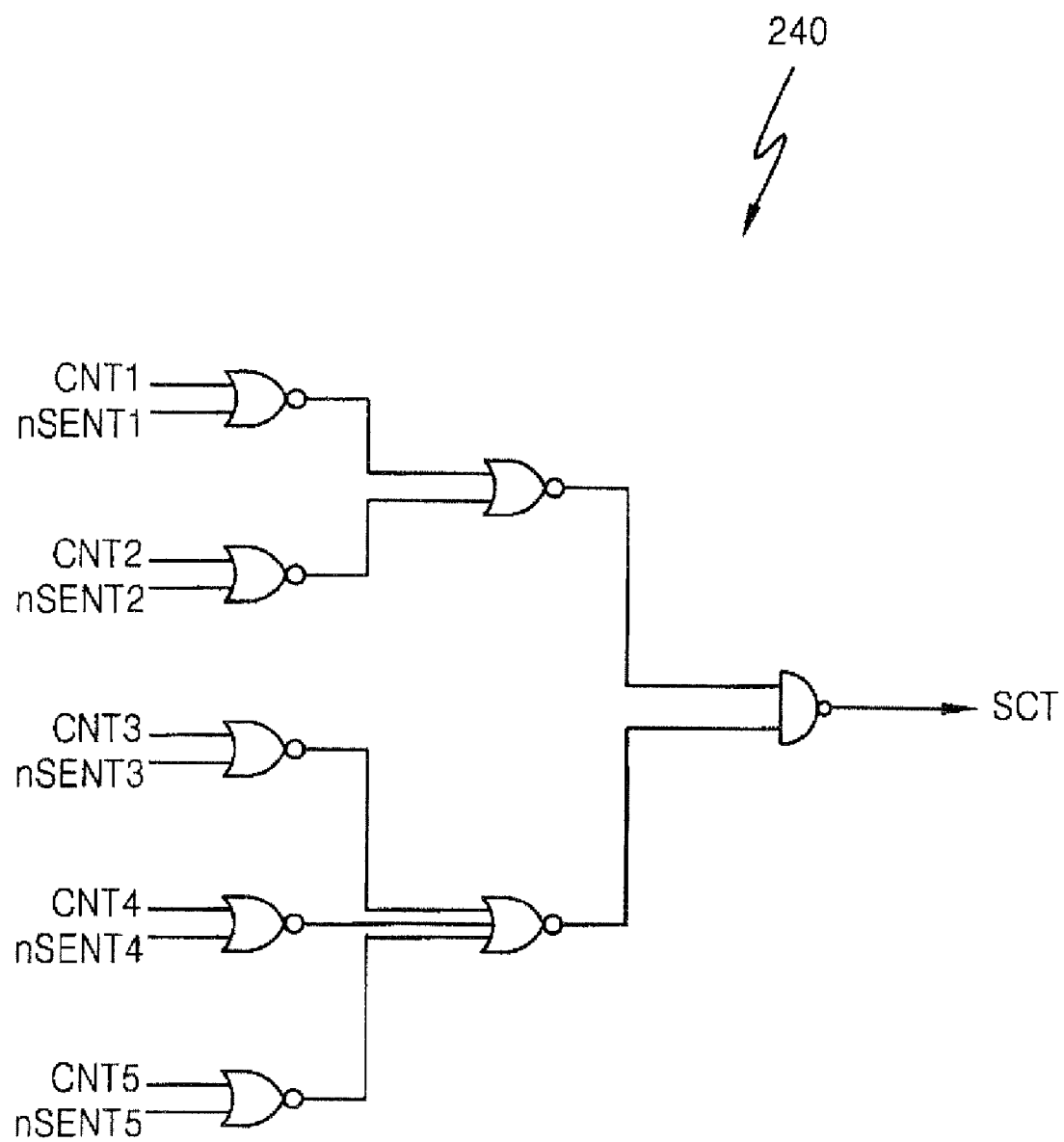
FIG. 9 is a logic diagram of a detailed example of a comparison unit of FIG. 4.

FIG. 9 shows a detailed example of the comparison unit 240 for the embodiment of FIG. 8. In FIG. 9, a case for n=5 is depicted. Assuming that the simultaneous program bit number SENUM is 8, 16 will be expressed as "01000" in binary form. In this case, signals in the group of set bit signals nSENT<n:1> are obtained by inverting "01000", which is data expressing 16 in binary form, and are shown in Table 1.

TABLE 1

| | Signal | | | | |
|---|---|---|---|---|---|
| | nSENT1 | nSENT2 | nSENT3 | nSENT4 | nSENT5 |
| Data | 1 | 0 | 1 | 1 | 1 |

In this case, signals nSENT1 to nSENT5 indicate data values in descending order of significance, and this indication method can be varied.

If respective signals in the group of counting bit signals CNT<n:1> have the same logic values as those of the group of set bit signals nSENT<n:1>, the logic level of the scan termination signal SCT, which is the output signal of the comparison unit 240, is changed from a logic L state to a logic H state.

In brief, if the circuit 201 for indicating the termination of bit scanning of bits to be programmed according to the present embodiment is used, the simultaneous program bit number SENUM can be externally adjusted even after the manufacture of the nonvolatile semiconductor memory device has been completed. Therefore, a designer or user of a nonvolatile semiconductor memory device to which the present embodiment is applied can adjust the number of bits that can be programmed through a single program operation, and the time required for a complete program operation can be remarkably shortened.

Figure 10:
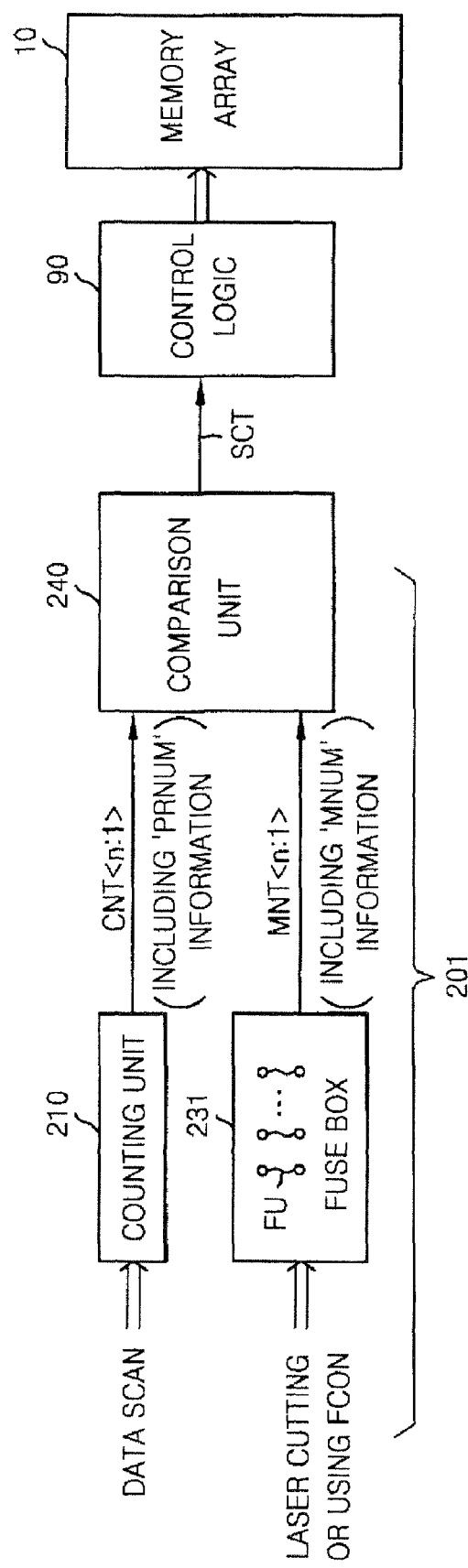
FIGS. 10 and 11 are block diagrams of a circuit for indicating the termination of bit scanning of bits to be programmed in a nonvolatile semiconductor memory device according to still another embodiment.
Figure 11:
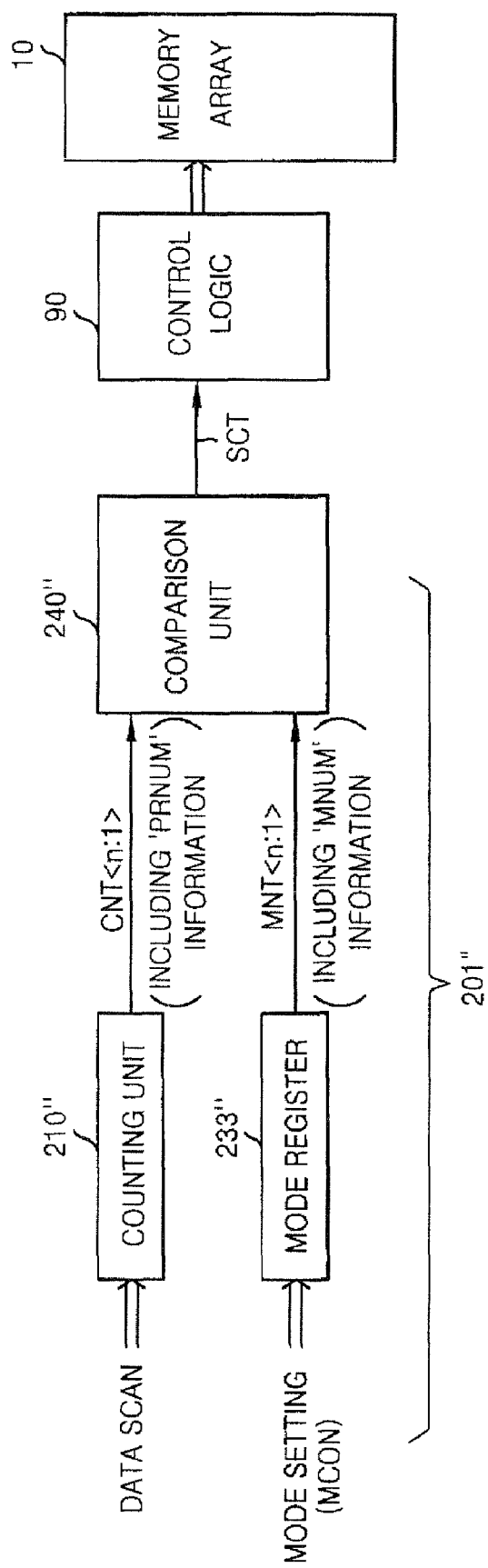

FIGS. 10 and 11 are block diagrams of circuits 201' and 201" for indicating the termination of bit scanning of bits to be programmed in a nonvolatile semiconductor memory device according to alternative embodiments, which are modified embodiments of the circuit 201 for indicating the termination of bit scanning of bits to be programmed in FIG. 8. The scan termination indication circuits 201' and 201" of FIGS. 10 and 11 are almost the same as the scan termination indication circuit 201 of the embodiment of FIG. 8, but there is a difference in a method of setting the simultaneous program bit number SENUM. That is, the scan termination indication circuit 201 of FIG. 8 is operated in such a way that any one of the number of fuse bits FNUM, provided from the fuse box 231, and the number of mode bits MNUM, provided from the mode register 233, is provided to the comparison unit 240 through the multiplexer MUX 235 as the simultaneous program bit number SENUM. In contrast, the scan termination indication circuit 201' of FIG. 10 is operated in such a way that the number of fuse bits FNUM set in a fuse box 231' is provided to a comparison unit 240'. In other words, in the embodiment of FIG. 10, the number of fuse bits FNUM is provided as the simultaneous program bit number SENUM. Further, in the scan termination indication circuit 201" of FIG. 11, the number of mode bits MNUM set in a mode register 233" is provided to a comparison unit 240". In other words, in the embodiment of FIG. 11, the number of mode bits MNUM is provided as the simultaneous program bit number SENUM.

The other aspects of construction and operation of the scan termination indication circuits 201' and 201" according to the embodiments of FIGS. 10 and 11 are the same as those of FIG. 8, so that detailed descriptions are omitted.

As described above, the present embodiment provides a circuit for indicating the termination of bit scanning of bits to be programmed, which is provided with a set bit number provision unit for setting the simultaneous program bit number indicating the number of bits to be programmed through a single program operation. Further, the simultaneous program bit number can be externally controlled. Therefore, the circuit for indicating the termination of bit scanning of bits to be programmed according to the present embodiment is advantageous in that a designer or user of a nonvolatile semiconductor memory device can adjust the number of bits to be programmed through a single program operation, and the time required for a complete program operation can be remarkably shortened.

Although the preferred embodiments have been disclosed for illustrative purposes, those skilled in the art will appreciate that various modifications, additions and substitutions are possible, without departing from the scope and spirit of the invention as disclosed in the accompanying claims. For example, NOR-type flash memory is disclosed in this specification. However, the spirit of the invention, such as the technology using a pipeline processing, is applicable to NAND-type flash memory and the system using it.

What is claimed is:

1. A program method for a nonvolatile semiconductor memory device, comprising the steps of:
   scanning data to be programmed to a memory cell array of the nonvolatile semiconductor memory device to select a first group of data bits to be programmed;
   programming the first group of data bits to the memory cell array when a maximum number of scanned data bits that can be programmed simultaneously is reached; and
   scanning a subsequent data to be written to the memory cell array to select a second group of data bits to be programmed while the selected first group of data bits that was previously scanned are programmed, wherein the nonvolatile semiconductor memory device is a flash memory and the first group of data bits and the second group of data bits are data bits with values of "0".

2. The program method as recited in claim 1, wherein the programming and scanning are performed using a pipeline processing.

3. The program method as recited in claim 1, wherein the programming and scanning comprise scanning for, and programming only one of two data values.

4. A nonvolatile semiconductor memory device comprising:
   a data scanning unit to scan data to be programmed to a memory cell array of the nonvolatile semiconductor memory device and to select first data bits to be programmed, the data scanning unit configured to scan and select second subsequent data bits to be programmed while the scanned first data bits are programmed; and
   a write driver to program the scanned first and second subsequent data bits to the memory cell array when a maximum number of bits scanned that can be programmed simultaneously is reached, the write driver receiving and storing the scanned first and second subsequent data bits, wherein the nonvolatile semiconductor memory device is a flash memory and the first data bits and the second subsequent data bits are data bits with values of "0".

5. The nonvolatile semiconductor memory device as recited in claim 4, wherein the write driver includes a write latch to receive and store the scanned first and second data bits.

6. The nonvolatile semiconductor memory device as recited in claim 4, wherein the programming and scanning are performed using a pipeline processing.

7. The nonvolatile semiconductor memory device as recited in claim 4, wherein only data values of "0" are scanned by the data scanning unit to be subsequently programmed by the write driver.

8. The nonvolatile semiconductor memory device as recited in claim 4, further comprising a control logic to control data input/output of the write driver and the data scanning unit.

9. The nonvolatile semiconductor memory device as recited in claim 4, further comprising an input/output buffer to store the input data bits and to provide the data bits to the data scanning unit.

10. A nonvolatile semiconductor memory device comprising:
    a data scanning unit to scan data to be programmed to a memory cell array to select first data bits to be programmed, the data scanning unit scanning subsequent data bits to be programmed while the first data bits are programmed;
    a write driver to program the scanned first and subsequent data bits to the memory cell array when a maximum number of bits scanned that can be programmed simultaneously is reached for the respective first and subsequent data bits and to receive and store the scanned first and subsequent data bits;
    an input/output buffer to store the data to be written and to provide to the data scanning unit the data to be written; and
    a control logic to control data input/output to/from the write driver and the data scanning unit, wherein the nonvolatile semiconductor memory device is a flash memory and the first and subsequent data bits are data bits with values of "0".

11. The nonvolatile semiconductor memory device as recited in claim 10, wherein only data values of "0" are scanned by the data scanning unit to be subsequently programmed by the write driver.

12. A scan termination indication circuit for indicating termination of bit scanning of selected data bits scanned from data to be programmed to a memory cell array in a nonvolatile semiconductor memory device, comprising:

a data scanning unit to scan data to be programmed to a memory cell array to select first data bits to be programmed, the data scanning unit scanning subsequent data bits to be programmed while the first data bits are programmed;

a counting unit for counting data bits to be programmed;

a write driver to program the scanned first and subsequent data bits to the memory cell array when a maximum number of bits scanned that can be programmed simultaneously is reached for the respective first and subsequent data bits and to receive and store the scanned first and subsequent data bits;

and a comparison unit for providing a scan termination signal that indicates when the number of counted data bits has attained an externally controllable program bit number, wherein the nonvolatile semiconductor memory device is a flash memory and the selected data bits are non-erase state data bits.

13. The scan termination indication circuit according to claim 12, wherein the program bit number indicates the number of data bits being simultaneously programmed by a single program operation.

14. The scan termination indication circuit according to claim 12, further comprising a set bit number provision unit for providing the program bit number.

15. The scan termination indication unit as recited in claim 12, where only data values of "0" are counted by the counting unit.

16. A nonvolatile semiconductor memory device comprising:

a data scanning unit to scan a first group of data bits to be programmed among input data bits, the data scanning unit scanning subsequent data bits to be programmed while the scanned first group of data bits are programmed;

a write driver to program scanned data bits to the memory cell array when a maximum number of bits scanned that can be programmed simultaneously is reached and to store the scanned data bits; and a scan termination indication circuit for indicating a termination of bit scanning of data bits to be programmed, for counting the data bits to be programmed, and for providing a scan termination signal used to control the programming, wherein the scan termination signal indicates that the number of counted data bits has attained an externally controllable program bit number, and wherein the nonvolatile semiconductor memory device is a flash memory and the first group of data bits and the subsequent data bits are data bits with values of "0".

17. The nonvolatile semiconductor memory device as recited in claim 16, further comprising a control logic to control data input/output of the write driver and the data scanning unit.

18. The nonvolatile semiconductor memory device as recited in claim 16, further comprising an input/output buffer to store the input data bits and to provide the data bits to the data scanning unit.

19. The nonvolatile semiconductor memory device as recited in claim 16, wherein only data values of "0" are scanned by the data scanning unit to be subsequently programmed by the write driver, and only data values of "0" are counted by the scan termination indication circuit.

20. A nonvolatile semiconductor memory device comprising:

a data scanning unit to scan data to be programmed to a memory cell array to select and count a first group of data bits to be programmed, wherein scanned and counted subsequent data bits to be programmed are scanned while the scanned and counted first group of data bits are programmed;

a write driver to program the scanned and counted data bits to the memory cell array when a maximum number of bits scanned that can be programmed simultaneously is reached, and to receive and store the scanned and counted data bits; and a scan termination indication circuit for indicating a termination of bit scanning of the data bits to be programmed, the scan termination indication circuit providing a scan termination signal used to control the programming and indicating when the number of counted data bits attains an externally controllable simultaneous program bit number, the simultaneous program bit number being able to be externally controlled, wherein the nonvolatile semiconductor memory device is a flash memory and the first group of data bits and the subsequent data bits are data bits with values of "0".

21. The nonvolatile semiconductor memory device as recited in claim 20, wherein only data values of "0" are scanned and counted by the data scanning unit to be subsequently programmed by the write driver.

* * * * *